United States Patent [19]

Watanabe et al.

[11] Patent Number: 5,059,401
[45] Date of Patent: Oct. 22, 1991

[54] MONOCRYSTAL GROWING APPARATUS

[75] Inventors: Masataka Watanabe, Niigata; Eiichi Machida, Jyouetsu, both of Japan

[73] Assignee: Shin-Etsu Handotai Co., Ltd., Tokyo, Japan

[21] Appl. No.: 557,784

[22] Filed: Jul. 26, 1990

[30] Foreign Application Priority Data

Jul. 31, 1989 [JP]  Japan .................... 1-199055

[51] Int. Cl.$^5$ ................. C30B 13/04; C30B 35/00
[52] U.S. Cl. ...................... 422/250; 156/606;
                                156/620.73; 156/DIG. 64
[58] Field of Search ............... 422/245, 250;
             156/620.73, 620.74, 620.7, 606, DIG. 64

[56]  References Cited
      U.S. PATENT DOCUMENTS

| | | | |
|---|---|---|---|
| 3,477,959 | 11/1969 | Colton | 156/606 |
| 3,488,157 | 1/1970 | Koffer | 422/249 |
| 4,039,283 | 8/1977 | Keller | 422/250 |
| 4,270,972 | 6/1981 | Crouse | 422/250 |
| 4,752,451 | 6/1988 | Aubert et al. | |
| 4,956,153 | 9/1990 | Yamagishi et al. | 156/617.1 |

FOREIGN PATENT DOCUMENTS

| | | |
|---|---|---|
| 1233828 | 2/1967 | Fed. Rep. of Germany . |
| 0264031 | 6/1989 | Fed. Rep. of Germany ... 156/620.7 |
| 2076731 | 10/1971 | France . |
| 1059916 | 2/1967 | United Kingdom ........... 422/250 |

OTHER PUBLICATIONS

IBM Technical Disclosure Bulletin, vol. 28, No. 1, Jun. 1985, Apparatus For Low To Medium Level Oxygen Czochralski Silicon Crystal Growth.

*Primary Examiner*—Olik Chaudhuri
*Assistant Examiner*—Kenneth Horton
*Attorney, Agent, or Firm*—Oliff & Berridge

[57]  ABSTRACT

A monocrystal growing apparatus having a separator provided in a chamber-defining housing for separating the part of a polycrystal rod supported by a vertical shaft, to produce a melt between the polycrystal rod and a seed crystal, from the doping gas atmosphere used during the melting operation. The separator is open to the chamber near the melt and a device passed an inert gas into the separator to prevent the doping gas from invading the chamber. The apparatus produces a monocrystal rod of a constant resistivity along its rod.

6 Claims, 5 Drawing Sheets

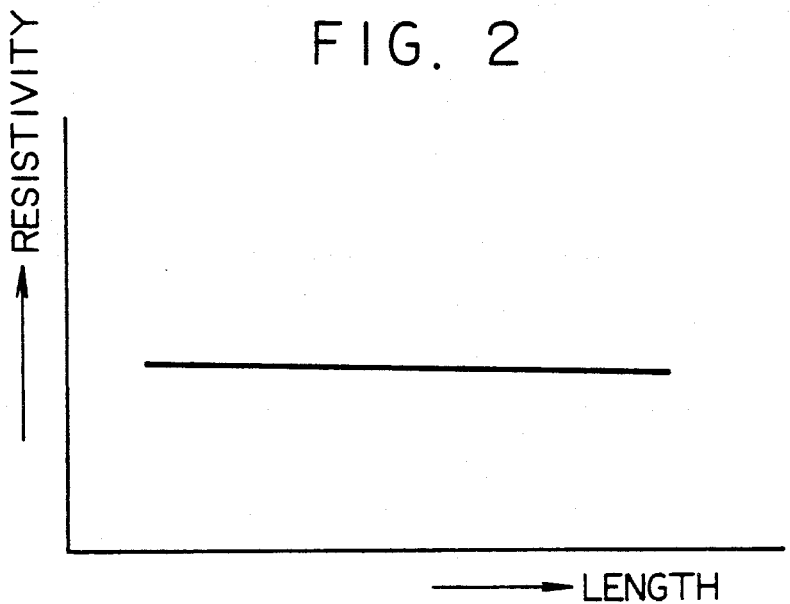
FIG. 2
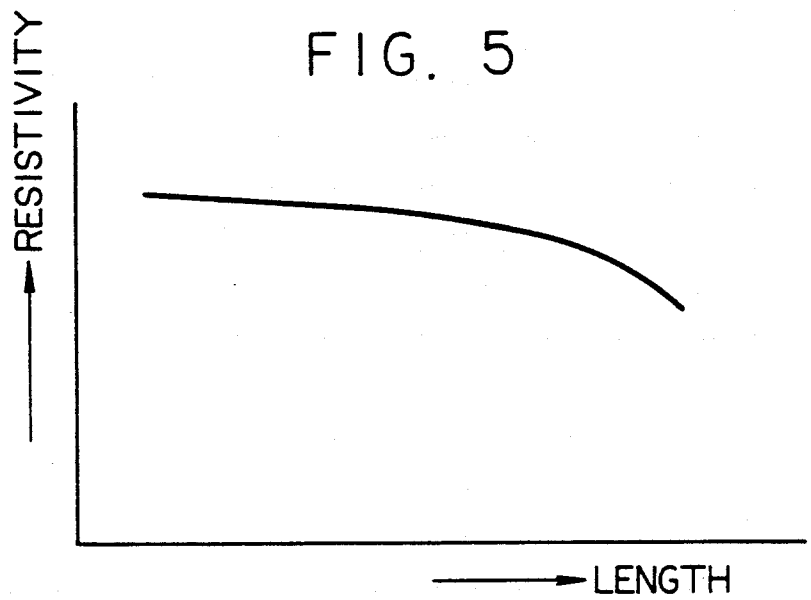
FIG. 5
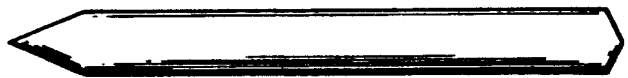

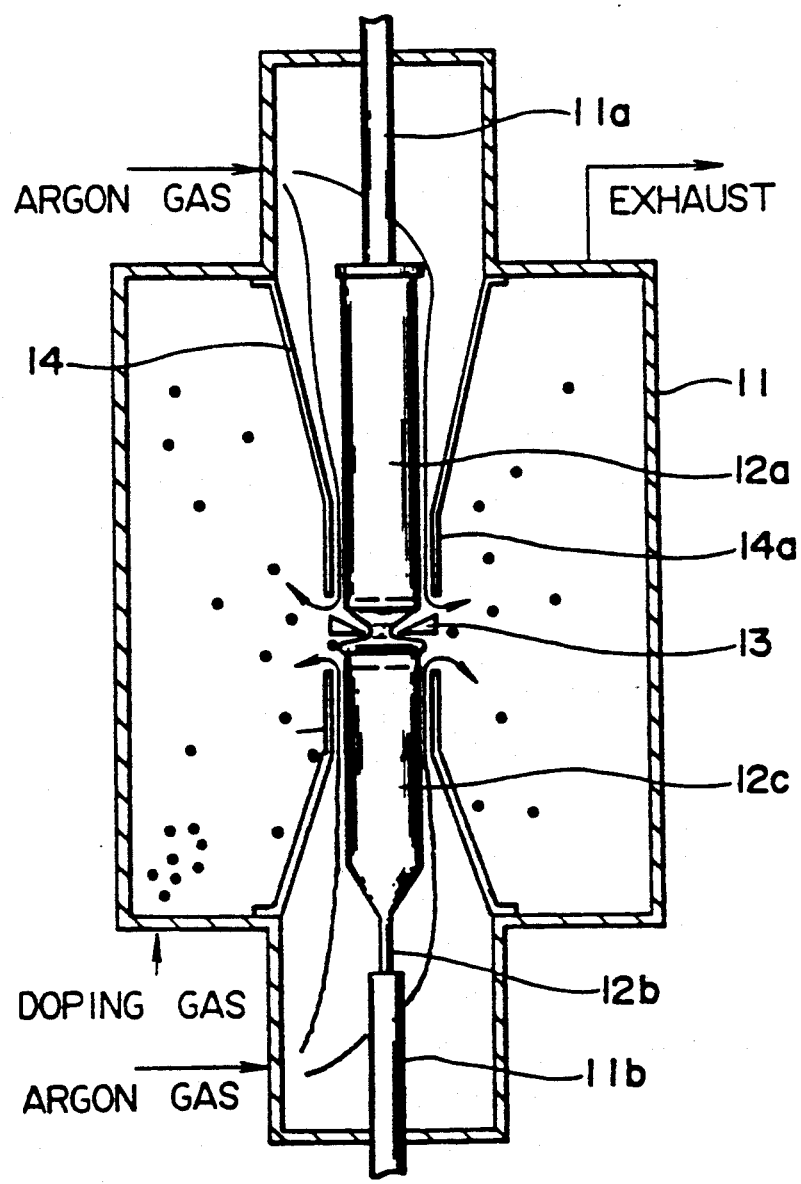

MONOCRYSTAL GROWING APPARATUS

BACKGROUND OF THE INVENTION

1. Field of the Invention

The present invention relates to a monocrystal growing apparatus and more particularly to a monocrystal growing apparatus building up a monocrystal rod by floating zone method.

2. Description of the Related Art

In accordance with floating zone method, an upper vertical shaft supports a polycrystal rod, a lower vertical shaft supports a seed crystal and a high-frequency coil connects both contacting tips of the polycrystal rod and the seed crystal by melting them. Then, the polycrystal rod and the seed crystal are rotated while the upper and lower vertical shafts are together descended, and a melting zone (i.e., melt) produced by the high-frequency coil is progressively transferred toward the polycrystal rod adjacent and above the melt, and thereby a monocrystal is grown on the seed crystal.

FIG. 4 illustrates this prior-art monocrystal growing apparatus. A chamber-defining housing is indicated at 1. The housing 1 has an upper vertical shaft 1a and a lower vertical shaft 1b which extend coaxially. The upper vertical shaft 1a coaxially supports a polycrystal rod 2a and the lower vertical shaft 1b coaxially supports a seed crystal 2b so that the polycrystal rod 2a and the seed crystal 2b are coaxially aligned. The housing 1 contains a dished single-turn high-frequency coil 3 placed essentially at the center of the chamber of the housing 1.

The respective upper and lower vertical shafts 1a and 1b of the prior-art monocrystal growing apparatus rotate the polycrystal rod 2a and the seed crystal 2b at equal or different rotational speeds and concurrently descend at an equal speed to progressively axially transfer the melt toward the polycrystal rod 2a adjacent and above the melt so as to build up a monocrystal rod 2c on the seed crystal 2b.

The housing 1 of the monocrystal growing apparatus receives a doping gas (e.g., $B_2H_6$ when the monocrystal rod 2c is p-type and on the other hand, $PH_3$ when the monocrystal rod 2c is n-type) introduced through the bottom end of the housing 1 in order to build up the p- or n-type monocrystal rod 2c of a predetermined resistivity. The monocrystal growing apparatus discharges a waste doping gas through the top of the housing 1.

The prior-art monocrystal growing apparatus has the following drawbacks in producing the p- or n-type monocrystal rod 2c:

That is, since the polycrystal rod 2a and monocrystal rod 2c (hereinafter, the two rods are commonly referred to as mere a semiconductor rod or semiconductor rods) are exposed to the atmosphere of the doping gas introduced into the housing 1, the impurity of the doping gas is not only dissolved directly into the melt but also decomposed to deposit on the high-temperature cylindrical surfaces of the semiconductor rods 2a adjacent the melt, so that the impurity is mixed and diffuses into the semiconductor rods in the course of melting of the semiconductor rods in a monocrystal growth step.

Thus, the resistivity of the monocrystal rod 2c depends on not only the amount of the impurity taken directly into the melt but also the amount of the impurity deposited on a part of the polycrystal rod 2a adjacent the melt and then directly or with a precedent diffusion dissolved in the melt, so that the resistivity of the monocrystal rod 2c is difficult to control.

That is, since the polycrystal rod 2a is progressively melted from the bottom towards the top, the polycrystal rod 2a receives the doping impurity at a progressively greater rate as the polycrystal rod 2a descends to melt because an upper part of the polycrystal rod 2a is longer exposed to the doping gas over the surface than a lower part of the same. The prior-art monocrystal growing apparatus entails a problem in that the product resistivity of the monocrystal rod 2c progressively decreases towards the tail of the monocrystal rod 2c as seen in FIG. 5.

The present invention was made in view of the above problem.

SUMMARY OF THE INVENTION

An object of the present invention is to provide a monocrystal growing apparatus producing a monocrystal rod with the resistivity essentially constant along the axis of the monocrystal rod.

In order to achieve the object, the monocrystal growing apparatus of the present invention comprises: a chamber-defining housing; an upper vertical rod extending into the chamber-defining housing, the upper vertical shaft supporting either of a polycrystal rod and a seed crystal; a lower vertical shaft extending into the chamber-defining housing coaxially with the upper vertical shaft, the lower vertical shaft supporting the other one of the polycrystal rod and the seed crystal; a high-frequency coil provided within the chamber-defining housing and melting a part of the polycrystal rod to produce a melting zone between the polycrystal rod and the seed crystal, the polycrystal rod and the seed crystal being rotated while the melting zone is progressively transferred toward the polycrystal rod provided adjacent and above the melting zone; means for introducing a doping gas into the chamber-defining housing; means, provided in the chamber-defining housing, for separating the whole part of the residual polycrystal rod other than the melting zone from the atmosphere including the doping gas, the separation means being open to the chamber near the melting zone; and means for passing an inert gas into the separation means so as to prevent the doping gas from invading the interior of the separation means, the monocrystal growing apparatus building up an impurity doped monocrystal.

In accordance with the present invention, the separation means and the inert gas passing means together protect the whole part of the polycrystal rod other than melting zone from taking in the doping impurity of the doping gas during monocrystal growing-up. The resistivity of a grown monocrystal rod essentially depends on only the rate of the doping impurity taken into the monocrystal rod directly through the melting zone. Thus, the present invention achieves a high-accurate resistivity control of the monocrystal rod and provides a monocrystal rod of a resistivity uniform across the full length of the monocrystal rod.

BRIEF DESCRIPTION OF THE DRAWINGS

FIG. 2 is a graph representing the resistivity along the longitudinal axis of a monocrystal rod built by the monocrystal growing apparatus of FIG. 1;

FIG. 5 is a graph representing the resistivity along the longitudinal axis of a monocrystal rod built by the prior-art monocrystal growing apparatus of FIG. 4;

FIG. 6 is a longitudinal section through a monocrystal growing apparatus of a third embodiment of the present invention

DESCRIPTION OF THE PREFERRED EMBODIMENTS

The preferred embodiments of the present invention will be described with reference to FIGS. 1-3 and 5 hereinafter.

Figure 1:
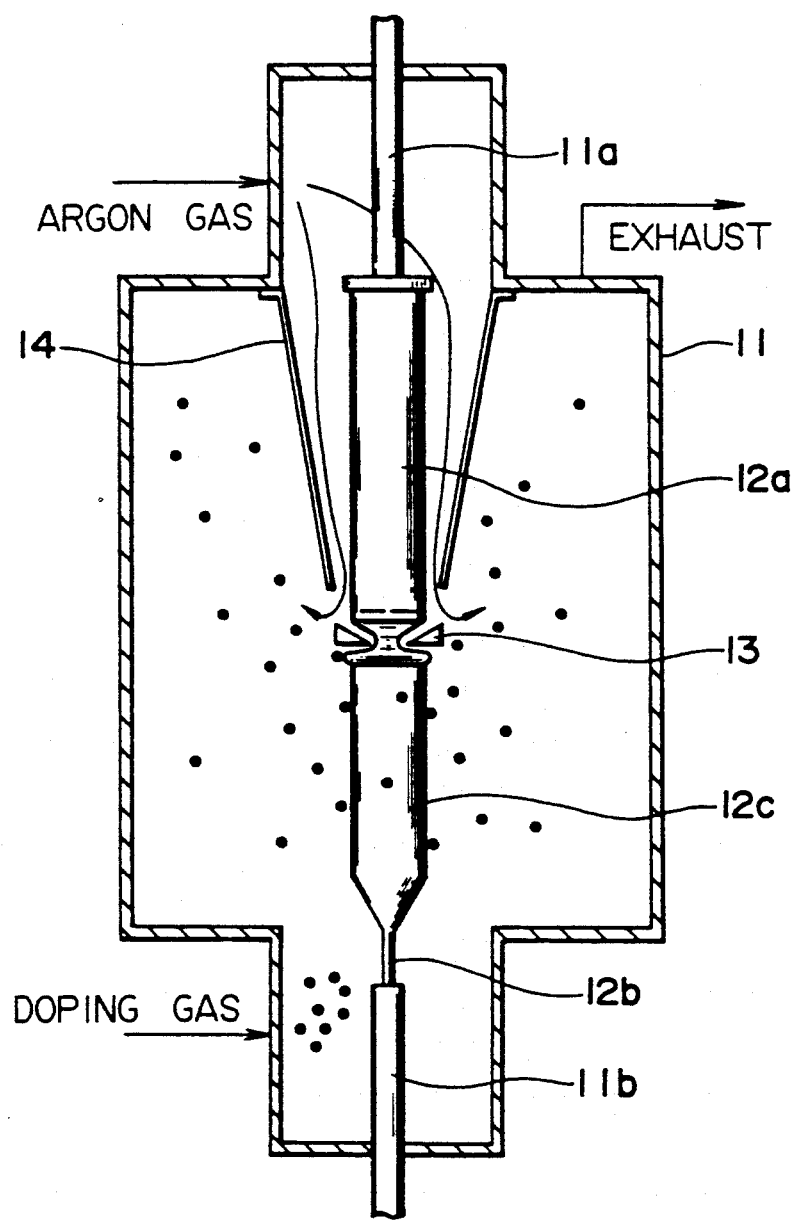
FIG. 1 is a longitudinal section through a monocrystal growing apparatus of a first embodiment of the present invention.

FIG. 1 illustrates a monocrystal growing apparatus of a first embodiment of the present invention. As shown in FIG. 1, the monocrystal growing apparatus comprises a chamber-defining housing 11, an upper vertical shaft 11a extending into the housing 11, a lower vertical shaft 11b extending into the housing 11 coaxially with the upper vertical shaft 11a, and a dished single-turn high-frequency coil 13 placed essentially at the center of the chamber. Both the upper and lower vertical shafts 11a and 11b are rotatable and vertically movable. The upper vertical shaft 11a coaxially supports a polycrystal rod 12a so that the top of the polycrystal rod 12a is fastened to the bottom of the upper vertical shaft 11a. The lower vertical shaft 11b coaxially supports a rod-shaped seed crystal 12b so that the bottom of the seed crystal 12b is fastened to the top of the lower vertical shaft 11b.

The housing 11 has a hood 14 fastened to the top wall thereof directly above the high-frequency coil 13 and covering or largely separating the whole part of the polycrystal rod 12a provided adjacent a melt in the polycrystal rod 12a from the atmosphere of a doping gas filling the chamber of the housing 11 and introduced through a bottom center projection of the housing 11. The bottom of the hood 14 is open to the chamber near the melt. The inner wall of the hood 14 is tapered with the narrower open bottom of the hood 14 depending towards the high-frequency coil 13. Inert gas, e.g., argon gas is passed into the hood 14 through a top center projection of the housing 11. The inert gas passes down through the interior of the hood 14 and a clearance between the polycrystal rod 12a and the wall edge of the open bottom of the hood 14 into the atmosphere of the doping gas.

The monocrystal growing apparatus of the first embodiment with the above arrangement builds up a monocrystal rod 12c. The hood 14 and the inert gas, passing down through the hood's interior and out its bottom, cooperate to separate the part of the polycrystal rod 12a, other than that adjacent the melt, from the atmosphere of the doping gas, so that the doping gas is not deposited onto the part removed from immediately adjacent the melt of the polycrystal rod 12a. That is, the part adjacent the melt of the polycrystal rod 12a cannot catch the impurity of the doping gas. Thus, the resistivity of the monocrystal rod 12c essentially depends on only the rate of the impurity taken directly into the melt. As shown in FIG. 2, the monocrystal growing apparatus of the first embodiment provides the monocrystal rod 12c of a resistivity constant along the axis of the monocrystal rod 12c.

Figure 3:
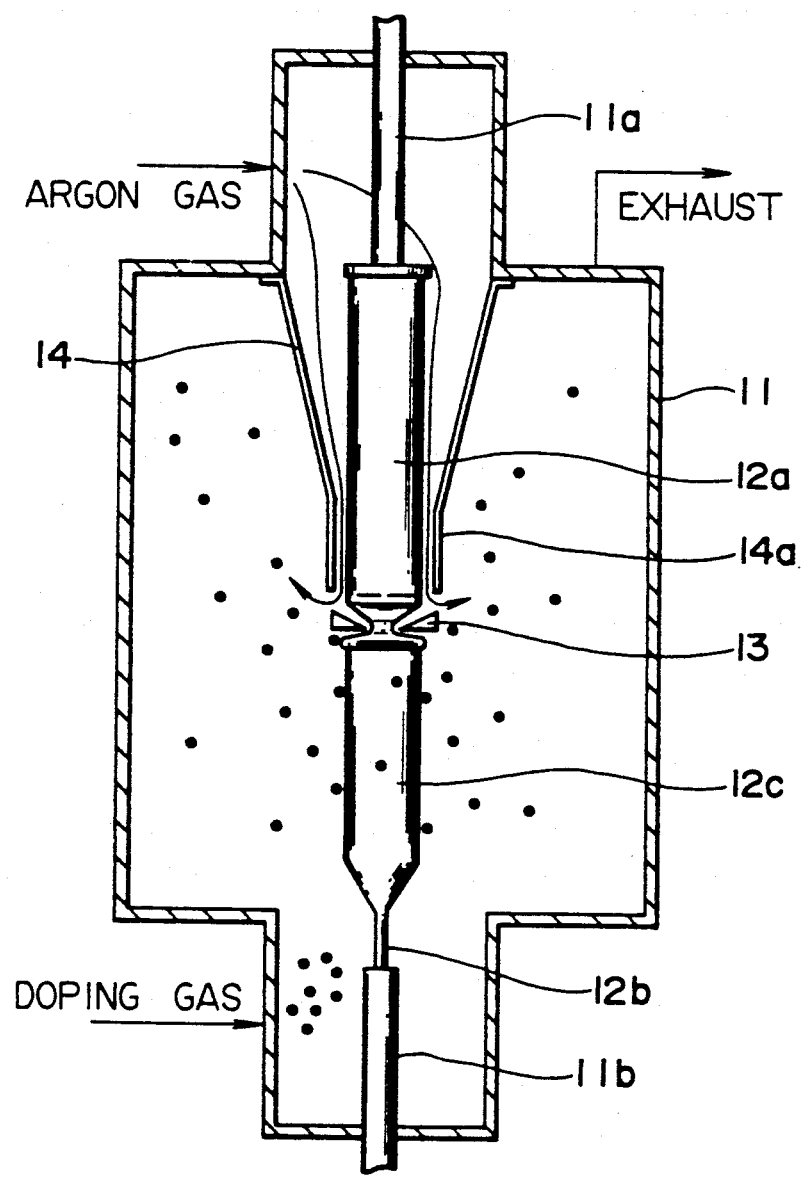
FIG. 3 is a longitudinal section through a monocrystal growing apparatus of a second embodiment of the present invention.
Figure 4:
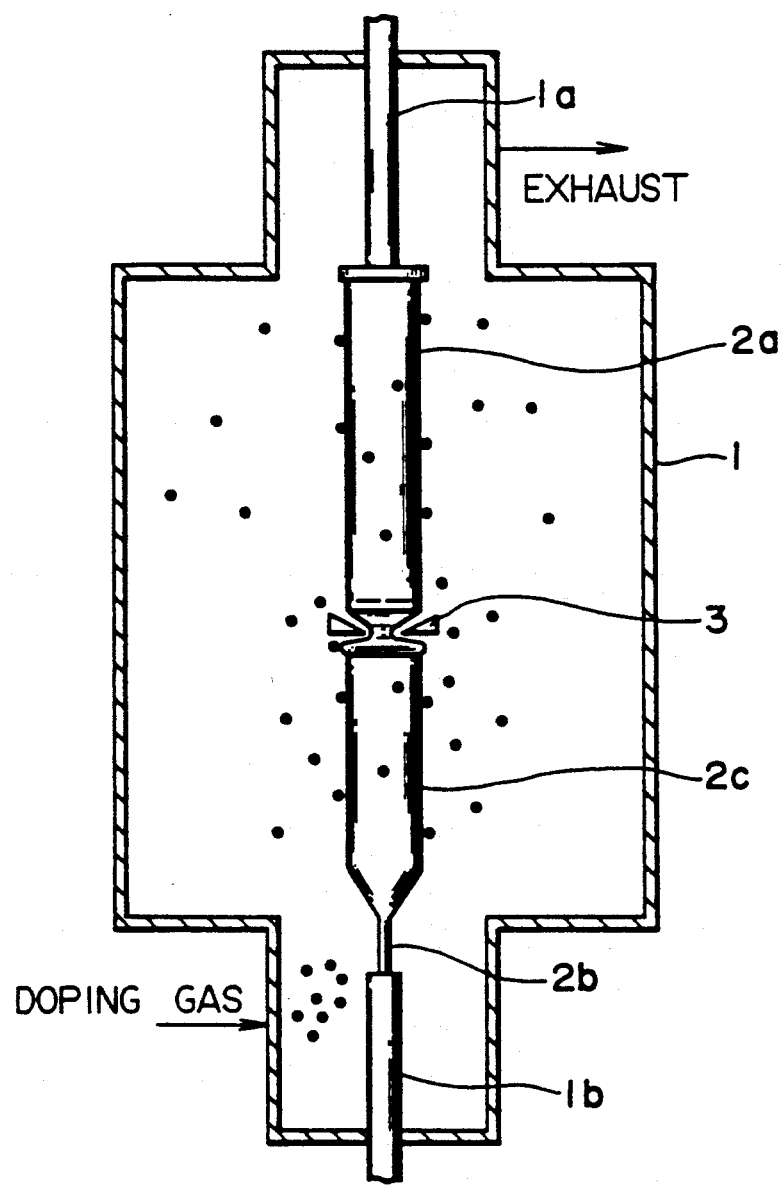
FIG. 4 is a longitudinal section through a prior-art monocrystal growing apparatus.

FIG. 3 illustrates a monocrystal growing apparatus of a second embodiment of the present invention. The second embodiment differs from the first embodiment in that a hood 14 of the second embodiment comprises a hollow cylindrical bottom portion 14a surrounding and coaxial to the polycrystal rod 12a with a predetermined narrow spacing between the inner wall of the hood bottom portion 14a and the polycrystal rod 12a. Since the portions of the monocrystal growing apparatus other than the hood bottom portion 14a have the same arrangements as those of the apparatus of the first embodiment, these portions have the same labels and descriptions as in the first embodiment.

The second embodiment has essentially the same advantages as the first embodiment. In accordance with the second embodiment, the narrow spacing extending between the hood bottom portion 14a and the polycrystal rod 12a reinforces the sealing operation of the inert gas so that the doping gas does not invade the interior of the hood 14. Thus, the second embodiment better facilitates the resistivity control in building up the monocrystal rod 12c.

In other embodiments of the present invention, such as illustrated in FIG. 6 a monocrystal growing apparatus may have essentially the same hood covering for largely separating the seed crystal 12b side adjacent the melt from the atmosphere of the doping gas.

In addition, alternatively the upper vertical shaft 11a can be used to support the seed crystal and lower vertical shaft 11b used to support the polycrystal rod.

A person skilled in the art would understand that various modifications and changes would be embodied without departing from the scope of the present invention.

What is claimed is:

1. A monocrystal growing apparatus, comprising:
a chamber-defining housing;
an upper vertical shaft extending into said chamber-defining housing, said upper vertical shaft supporting one of a polycrystal rod and a seed crystal;
a lower vertical shaft extending into said chamber-defining housing coaxially with said upper vertical shaft, said lower vertical shaft supporting the other of the polycrystal rod and the seed crystal;
a heating means provided within said chamber-defining housing and melting a part of the polycrystal rod to produce a melt between the polycrystal rod and the seed crystal, the polycrystal rod and the seed crystal being rotated while the melt is progressively displaced relative to a length of the polycrystal rod provided adjacent the melt;
means for introducing a doping gas into said chamber-defining housing;
means, provided in said chamber-defining housing, for separating a remaining part of the polycrystal rod other than the melt from the atmosphere of the doping gas, said separation means containing the remaining part of the polycrystal rod and extending from an end remote from the melt of the polycrystal rod towards the melt along the polycrystal rod, said separation means terminating before the vertical position of the melt so that the melt is left outside said separation means and is exposed to the atmosphere of the doping gas; and
means for passing an inert gas into said separation means so as to prevent the doping gas from invading said separation means, the monocrystal growing apparatus thereby building up a monocrystal having a constant impurity level along its longitudinal axis.

2. A monocrystal growing apparatus as recited in claim 1, wherein said separation means comprises a hood.

3. A monocrystal growing apparatus as recited in claim 2, wherein the hood includes a hollow cylindrical portion surrounding a part of the polycrystal rod adjacent the melting zone with a predetermined spacing defined between the interior surface of the cylindrical portion and the polycrystal rod.

4. A monocrystal growing apparatus as recited in claim 2, wherein the interior surface of the hood is tapered to the bottom of the hood.

5. A monocrystal growing apparatus as recited in claim 1, further comprising:
   second means for separating a seed crystal side adjacent the melting zone from the atmosphere of the doping gas, said second separation means being open to the chamber near the melting zone; and
   second means for introducing an inert gas into said second separation means.

6. A monocrystal growing apparatus as claimed in claim 1, wherein said heating means comprises a high-frequency coil.

* * * * *

UNITED STATES PATENT AND TRADEMARK OFFICE
CERTIFICATE OF CORRECTION

PATENT NO. : 5,059,401

DATED : October 22, 1991

INVENTOR(S) : Masataka WATANABE and Eiichi MACHIDA

It is certified that error appears in the above-identified patent and that said Letters Patent is hereby corrected as shown below:

IN THE ABSTRACT

Line 7, change "passed" to --passes--;

Line 10, change "rod" (second occurrence) to --axis--.

Signed and Sealed this

Ninth Day of March, 1993

*Attest:*

STEPHEN G. KUNIN

*Attesting Officer*    *Acting Commissioner of Patents and Trademarks*